United States Patent [19]

Beerman

[11] 4,401,910

[45] Aug. 30, 1983

[54] MULTI-FOCUS SPIRAL ULTRASONIC TRANSDUCER

[75] Inventor: Henry P. Beerman, Lexington, Mass.

[73] Assignee: Analogic Corporation, Wakefield, Mass.

[21] Appl. No.: 325,679

[22] Filed: Nov. 30, 1981

[51] Int. Cl.$^3$ .................................................. H03J 3/28

[52] U.S. Cl. ...................................... 310/369; 73/642; 128/660; 310/334; 350/296

[58] Field of Search .................. 73/640, 642; 128/660; 310/320, 334, 335, 800, 369, 367; 350/432, 452, 292, 296, 151, 157, 164, 452; 367/151, 157

[56] References Cited

U.S. PATENT DOCUMENTS

| | | | |
|---|---|---|---|
| 3,390,399 | 6/1968 | Leonard | 350/452 |
| 3,924,453 | 12/1975 | Clark et al. | 73/67.8 S |
| 4,230,094 | 10/1980 | Szulmayer | 126/439 |
| 4,296,349 | 10/1981 | Nakanishi et al. | 310/335 |
| 4,319,490 | 3/1982 | Hartmann, Jr. | 73/642 |
| 4,350,917 | 9/1982 | Lizzi et al. | 310/320 |

FOREIGN PATENT DOCUMENTS

| | | | |
|---|---|---|---|
| 473945 | 12/1975 | U.S.S.R. | 73/642 |

*Primary Examiner*—J. D. Miller
*Assistant Examiner*—D. L. Rebsch
*Attorney, Agent, or Firm*—Weingarten, Schurgin, Gagnebin & Hayes

[57] ABSTRACT

An ultrasonic transducer providing a plurality of different focal lengths within a unitary structure and comprising a piezoelectric element having a cylindrical spiral surface with respective sections of the spiral surface providing respective different focal lengths. Each section of the spiral surface can include electrodes in the form of a Fresnel zone pattern to provide focusing in the orthogonal dimension to the spiral axis.

14 Claims, 7 Drawing Figures

MULTI-FOCUS SPIRAL ULTRASONIC TRANSDUCER

FIELD OF THE INVENTION

This invention relates to ultrasonic transducers and more particularly to a transducer having multiple focal lengths in a single unitary structure.

BACKGROUND OF THE INVENTION

Ultrasonic transducers, employed for example for medical diagnostic purposes, are known in which the transducer is focused for an intended focal length. Such transducers generally include a spherically curved ceramic piezoelectric element supported on an acoustic backing material, or a flat piezoelectric element supported on a acoustic backing material with an acoustic lens disposed on the front surface of the flat element to provide the intended focusing. These known transducers are operative for only a single focal length, and a different transducer must be constructed for each focal length of interest.

SUMMARY OF THE INVENTION

Briefly, the present invention provides an ultrasonic transducer which, within a single unitary structure, provides a plurality of different focal lengths. The novel transducer comprises a piezoelectric element having a cylindrical spiral or generally cylindrical spiral surface with respective sections or zones of the cylindrical spiral providing respective different focal lengths. Preferably, the piezoelectric element is a plastic piezoelectric film, such as polyvinylidene fluoride ($PVF_2$), disposed on a support member providing the cylindrical spiral surface. The sections each have a corresponding focus lying in a common plane disposed transversely to the spiral surface. The curved surface of the spiral provides focusing in one dimension, along the length of the spiral. Focussing in the orthogonal dimension is provided by a Fresnel zone pattern on the front surface of each section of the piezoelectric film. The zone pattern is formed by electrodes on the front surface of the film extending across the width of the film. The front electrodes of the several sections are electrically connected in series or parallel, or in a series-parallel combination, depending upon the capacitance and reactance required for specific applications. The electrode pattern for each section terminates in a respective electrical terminal for coupling to excitation or reception circuitry. A rear electrode is provided on the back surface of the film, typically in the form of a continuous conductive layer with a common terminal for all sections. The Fresnel pattern can be eliminated and replaced by a continuous electrode for each zone on the front surface of the spiral film in applications where ultrasonic focusing is desired in only one dimension in order to provide a line focus.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
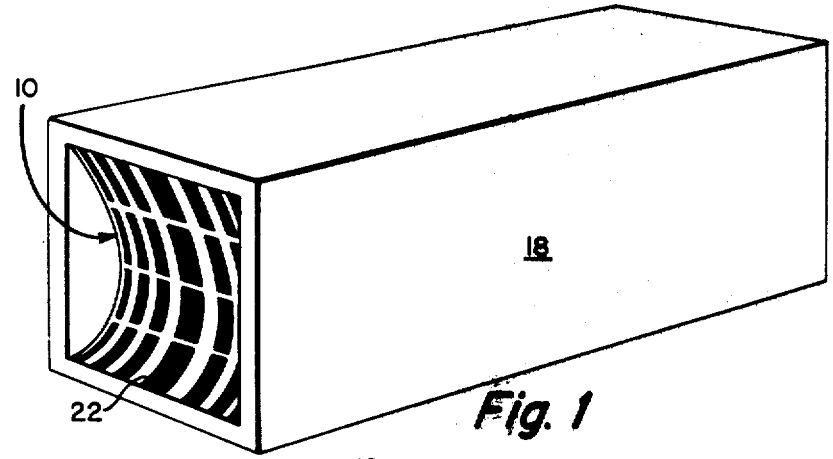
FIG. 1 is a pictorial view of a multiple focus ultrasonic transducer in accordance with the invention.
Figure 3:
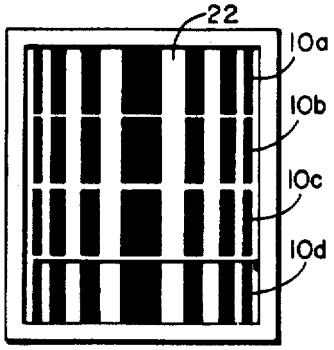
FIG. 3 is a front view of the transducer of FIG. 1.
Figure 2:
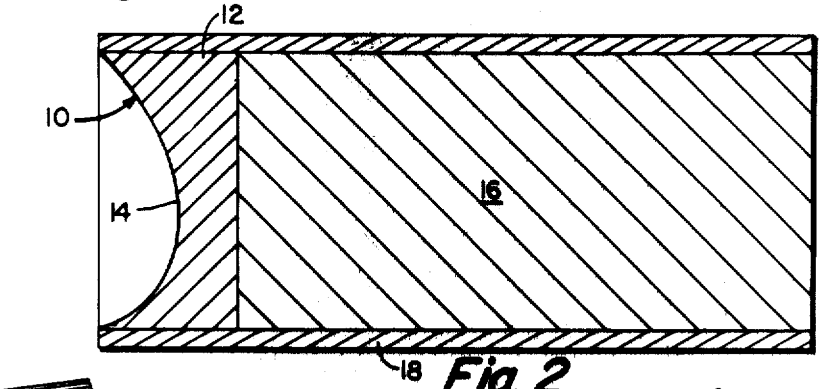
FIG. 2 is a side elevation view of the transducer of FIG. 1.
Figure 4:
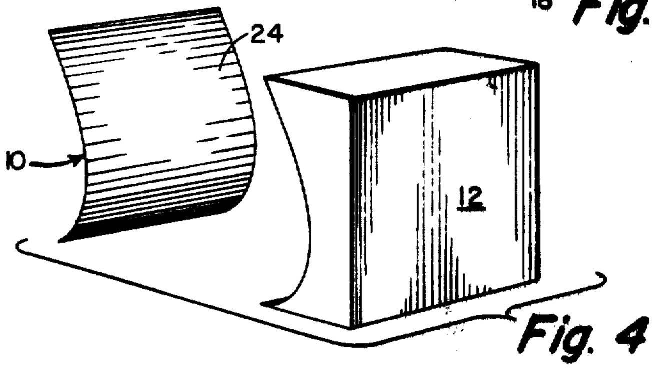
FIG. 4 is an exploded pictorial view of the piezoelectric film and backing.
Figure 7:
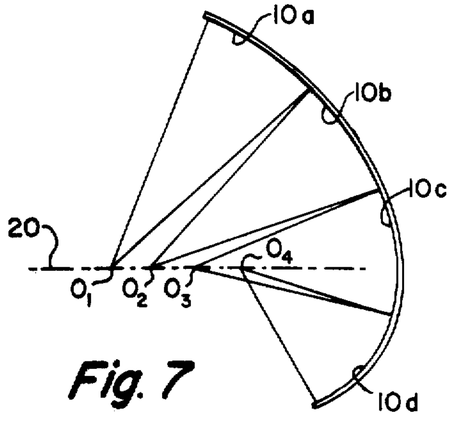
FIG. 7 is a diagrammatic side view of the piezoelectric element illustrating the multiple foci.

Referring to FIGS. 1 and 2, there is shown an ultrasonic transducer constructed in accordance with the invention and which comprises a piezoelectric film 10 supported on a support or backing 12 of acoustic damping material and having a cylindrical spiral-shaped surface 14 of uniform width and length which is of spiral or generally spiral configuration. A filler material 16 for acoustic damping is disposed rearward of support 12, the entire assembly being contained within a housing 18. As seen in FIG. 1 and FIG. 3, the piezoelectric film 10 is divided into respective sections along the length thereof, each section having a respective different focal length. Referring to FIG. 7, section **10*a* has a focus at $0_1$, section 10*b* has a focus at $0_2$, section 10*c* has a focus at $0_3$, and section 10*d* has a focus at $0_4$. The focal points $0_1$ through $0_4$ lie along an axis 20** which is the optical axis of the transducer. The sections can be of continuously increasing radius to provide a true spiral, or each section can be of constant or more uniform radius to approximate a spiral path.

Each section of the film 10 has a Fresnel zone pattern thereon across the width of the film surface to provide focusing in the width dimension. Focussing in the longitudinal direction of the spiral is provided by the curved surfaces of the spiral sections. The Fresnel zone pattern for each section is slightly different from the others to account for the different focal lengths. The Fresnel pattern for each section is provided by conductive strips 22 formed on the front surface of the film 10, the front electrodes being electrically interconnected to provide an intended capacitance and reactance. A rear electrode 24 is provided on the rear surface of the film 10 in the form of a continuous conductive layer providing a common electrode for the several spiral sections.

Figure 5:
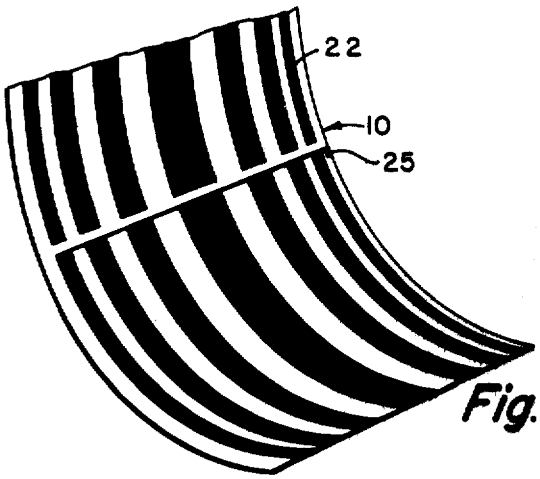
FIG. 5 is a cutaway pictorial view illustrating the electrode pattern on one section of the spiral surface.

The Fresnel zone pattern for one spiral section is illustrated in FIG. 5. The pattern includes a plurality of electrode areas symmetric about a center line, each of the electrode areas being of defined width and spaced from adjacent electrode areas by a defined amount. The center line of each electrode area lies at a distance d from the center line of the Fresnel pattern and can be found by $$d = \pm[(n\lambda)(2a + n\lambda)]^{\frac{1}{2}} \qquad \text{Eq. 1}$$

where

- n is a successive integer 0, 1, 2, 3, etc., for each electrode area;
- a is the mean focal length for the particular section of the spiral surface; and
- λ is the wavelength per cycle.

The width of each electrode area Δd can be obtained by substituting n±0.25 for the integer n in equation 1. The center of each area between the electrode areas can be found by substituting (2n+1)/2 for the integer n in equation 1.

If the number of electrode areas is relatively small, equation 1 reduces to $$d=\pm(2an\lambda)^{\frac{1}{2}} \quad \text{Eq. 2}$$

As an example, for a frequency f of 1 MHz, a focal length of 10 centimeters, and a sound velocity v in water of $1.5\times10^5$ centimeters per second, the wavelength $\lambda$ is equal to $v/f=(1.5\times10^5)/10^6=0.15$ centimeters per cycle. Thus, the center of the electrode areas in the section under discussion are expressed as follows:

$$d=\pm(2a\lambda)^{\frac{1}{2}}(n)^{\frac{1}{2}}=1.732\ n^{\frac{1}{2}} \quad \text{Eq. 3}$$

For purposes of the above example, the section is considered as having a constant radius, and therefore constant focal length, throughout its extent. Since the surface is actually a portion of a cylindrical spiral which has a slightly varying focal length throughout its zone length, the location of the electrode areas should be calculated for the mean focal length for the zone. Or, the electrode areas can be calculated separately for the end portions of a zone to accommodate the focal length variations.

For each section of the spiral, the electrode areas are electrically connected in series or parallel, or in a series-parallel combination to provide an intended capacitance to achieve a reactance of particular value, typically in the range of 25–50 ohms. Each section has a respective electrical terminal 25 (FIG. 5) for connection to electronic circuitry for energizing the transducer for transmission for receiving and processing signals produced in response to received ultrasonic energy. The rear electrode is common to all sections and has a common terminal which serves as the second terminal for all sections. In the illustrated embodiment, the piezoelectric film is polyvinylidene fluoride ($PVF_2$), and the electrodes are formed of a nickel-chrome alloy. The electrodes are provided on the film in any known manner, such as by vacuum sputtering. The polyvinylidine fluoride has a broadband frequency response, and therefore the thickness of the film is not as critical as with typical PZT materials which have a much narrower band frequency response. For a frequency constant of about 20 KHz-inches, the film operative at 1 MHz can have a thickness of about 250–500 microns. For a dielectric constant K of 13, the capacitance C for each square centimeter of the electrode area of a Fresnel pattern is $$C=e'K/t \quad \text{Eq. 4}$$

where e' is the permittivity of free space ($0.088\times10^{-12}$) and where t is the film thickness in centimeters. For a film thickness of 250 microns, the capacitance C is equal to 46 picofarads per square centimeter. For a reactance $X_c$ of 50 ohms, the capacitance is $$C=(2\pi fX_c)^{-1}=3185 \text{ picofarads} \quad \text{Eq. 5}$$

For each section or zone in which the electrode areas are connected in parallel, the total electrode area is 3185 picofarads/46 picofarads per square centimeter, which equals 69 square centimeters.

In the event that focusing in two orthogonal axes is not needed, the Fresnel pattern can be eliminated, and the front electrode provided by a continuous electrode film formed on each section of the front surface of the piezoelectric material, each front electrode having a respective electrical terminal. In this version, a line focus would be provided by each section of the spiral surface, as distinguished from a point focus provided in the embodiment described above.

Figure 6:
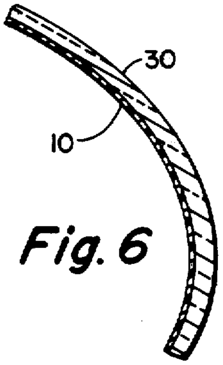
FIG. 6 is a side view of an alternative embodiment of the novel transducer employing two piezoelectric elements.

Another embodiment is shown in FIG. 6 in which a piezoelectric film 10 is supported on a ceramic piezoelectric material 30 such as PZT (lead zirconate titanate). Both piezoelectric materials are disposed in a cylindrical spiral path, as in the above embodiment. This dual layer structure is supported on an acoustic damping backing material, as in the above embodiment, and can otherwise be similarly housed. In typical fabrication, the PZT material 30 is bent into the spiral configuration while in its plastic state prior to firing, and after firing, it will retain its spiral shape. The piezoelectric film 10 can then be bonded to the PZT material. Front and rear electrodes are provided for each piezoelectric layer, the electrode areas being connected to respective terminals. The Fresnel electrode pattern can be provided for each zone on the front surface of the film, and on the rear surface of the PZT layer, with a common electrode layer interposed between the rear surface of the film and the front surface of the PZT material. Alternatively, each piezoelectric layer can have the Fresnel pattern for each zone on its front surface, and a rear electrode layer on its rear surface, with an electrically insulating spacer provided between the front electrodes of the PZT material and the rear electrode of the film material to maintain electrical isolation between the two transducers.

The polyvinylidene fluoride film is more effective for ultrasonic reception than for transmission, while the PZT material is superior for transmission rather than reception. Thus, in the composite structure illustrated in FIG. 6, the PZT layer is energized with an appropriate driving signal for transmitting ultrasonic energy in a focused manner to an object under study, and the film layer is operative to receive energy preferentially focused onto the respective section or zone of the film to generate output signals representative of received ultrasonic energy.

The novel transducer finds particular application as an immersion transducer for medical diagnostic purposes. The immersion transducer is placed in a vessel containing water or other liquid, the transducer being spaced from the subject by the interposed liquid. Ultrasonic energy is coupled via the liquid from the transducer to the subject, which is also immersed in the liquid. Alternatively, a thin layer of liquid or gel can be employed to couple the transducer directly to living tissue.

The invention is also useful in other frequency applications. For example, the transducer can be employed for sonar, in which case the transducer dimensions would be appropriately scaled up to accommodate the lower frequencies employed for sonar work. For medical diagnostic purposes, frequencies are typically in the range of 1–10 MHz, while sonar is operative at about 30 KHz.

The invention is not to be limited except as indicated in the appended claims.

What is claimed is:

1. An ultrasonic transducer comprising:

a piezoelectric element having a cylindrical spiral surface, the surface having respective sections along the length thereof, each of a different focal length;

a rear electrode provided on the rear surface of the piezoelectric element;

a front electrode provided on the front surface of each section of the piezoelectric element; and means for supporting the piezoelectric element and electrode layers.

2. The transducer of claim 1 wherein the front electrode for each section includes:

a one-dimensional Fresnel zone pattern on the front surface of the section of the spiral surface and disposed along an axis transverse to the spiral axis;

each section having a Fresnel zone pattern of different focal length corresponding to the focal length of the associated section of the spiral surface.

3. The transducer of claim 1 wherein the Fresnel zone pattern for each section of the spiral surface is symmetric about the center line of the spiral surface.

4. The transducer of claim 1 wherein the piezoelectric element is a piezoelectric film disposed in a cylindrical spiral path.

5. The transducer of claim 4 wherein the piezoelectric film is of polyvinylidine fluoride.

6. An ultrasonic transducer comprising:

a piezoelectric element having a cylindrical spiral surface, the surface having respective sections along the length thereof, each of a different focal length, the element having a front surface and a rear surface;

a rear electrode provided on the rear surface of the piezoelectric element;

a front electrode provided on the front surface of each section of the piezoelectric element;

the front electrode for each section including a one dimensional Fresnel zone pattern on the front surface of the section of the spiral surface and disposed along an axis transverse to the spiral axis; and each section having a Fresnel zone pattern of different focal length corresponding to the focal length of the associated section of the spiral surface, the Fresnel zone pattern for each section being provided by an array of spaced electrode areas, the array extending along the spiral axis.

7. The transducer of claim 6 wherein the electrode areas of each section are electrically interconnected to provide a predetermined capacitance and reactance.

8. An ultrasonic transducer comprising:

a piezoelectric element having a cylindrical spiral surface, the surface having respective sections along the length thereof, each of a different focal length, the element having a front surface and a rear surface;

a rear electrode provided on the rear surface of the piezoelectric element;

a front electrode provided on the front surface of each section of the piezoelectric element;

means for supporting the piezoelectric element and electrode layers;

the front electrode for each section including a one-dimensional Fresnel zone pattern on the front surface of the section of the spiral surface and disposed along an axis transverse to the spiral axis, each section having a Fresnel zone pattern of different focal length corresponding to the focal length of the associated section of the spiral surface; wherein the Fresnel zone pattern includes electrode areas, each extending along the longitudinal axis of the spiral surface, the pattern extending across the transverse axis, the electrode area being of defined width and spacing for the respective sections.

9. The transducer of claim 8 wherein the Fresnel zone pattern for each section of the spiral surface is of different width and spacing to provide a respective focal length.

10. The transducer of claim 9 wherein the supporting means includes acoustic damping material.

11. The transducer of claim 9 wherein the supporting means includes a block of acoustic damping material having a cylindrical spiral surface on which the piezoelectric element is disposed.

12. The transducer of claim 11 wherein the piezoelectric element has a uniform width.

13. An ultrasonic transducer comprising:

a housing;

a piezoelectric element supported in the housing and having a cylindrical spiral surface, the surface having respective sections along the length thereof, each of a diffrent focal length;

a front electrode provided on the front surface of each section of the piezoelectric element; and a rear electrode provided on the rear surface of the piezoelectric element.

14. The transducer of claim 13 wherein the front electrode for each section includes:

a one-dimensional Fresnel zone pattern on the front surface of the section of the spiral surface and disposed along an axis transverse to the spiral axis;

each section having a Fresnel zone pattern of different focal length corresponding to the focal length of the associated section of the spiral surface.

* * * * *